(12) United States Patent
Kar et al.

(10) Patent No.: US 8,835,278 B2
(45) Date of Patent: Sep. 16, 2014

(54) METHOD FOR FORMING A BURIED DIELECTRIC LAYER UNDERNEATH A SEMICONDUCTOR FIN

(75) Inventors: Gouri Sankar Kar, Heverlee (BE); Antonino Cacciato, Heverlee (BE); Min-Soo Kim, Leuven (BE)

(73) Assignee: IMEC, Leuven (BE)

( * ) Notice: Subject to any disclaimer, the term of this patent is extended or adjusted under 35 U.S.C. 154(b) by 0 days.

(21) Appl. No.: 13/885,884

(22) PCT Filed: Nov. 16, 2011

(86) PCT No.: PCT/EP2011/070273
§ 371 (c)(1),
(2), (4) Date: Nov. 15, 2013

(87) PCT Pub. No.: WO2012/066049
PCT Pub. Date: May 24, 2012

(65) Prior Publication Data
US 2014/0065794 A1    Mar. 6, 2014

Related U.S. Application Data

(60) Provisional application No. 61/415,302, filed on Nov. 18, 2010.

(30) Foreign Application Priority Data

Jan. 25, 2011   (EP) .................................. 11152112

(51) Int. Cl.
*H01L 21/76*     (2006.01)
*H01L 21/762*    (2006.01)
*H01L 21/8234*   (2006.01)
*H01L 27/115*    (2006.01)

(52) U.S. Cl.
CPC .... *H01L 21/76224* (2013.01); *H01L 21/76281* (2013.01); *H01L 21/823431* (2013.01); *H01L 21/76208* (2013.01); *H01L 27/11521* (2013.01)
USPC .......................................... 438/404; 438/424

(58) Field of Classification Search
USPC .......................................... 438/400, 404, 424
See application file for complete search history.

(56) References Cited

U.S. PATENT DOCUMENTS

| 4,845,048 A | 7/1989 | Tamaki et al. |
| 5,691,230 A | 11/1997 | Forbes |

(Continued)

FOREIGN PATENT DOCUMENTS

JP    01308079    12/1989

OTHER PUBLICATIONS

PCT International Search Report and Written Opinion, PCT International Application No. PCT/EP2011/070273 dated Mar. 26, 2012.

(Continued)

*Primary Examiner* — Bradley K Smith
(74) *Attorney, Agent, or Firm* — McDonnell Boehnen Hulbert & Berghoff LLP

(57) ABSTRACT

Disclosed are methods for forming a localized buried dielectric layer under a fin for use in a semiconductor device. In some embodiments, the method may include providing a substrate comprising a bulk semiconductor material and forming at least two trenches in the substrate, thereby forming at least one fin. The method further includes filling the trenches with an insulating material and partially removing the insulating material to form an insulating region at the bottom of each of the trenches. The method further includes depositing a liner at least on the sidewalls of the trenches, removing a layer from a top of each of the insulating regions to thereby form a window opening at the bottom region of the fin, and transforming the bulk semiconductor material of the bottom region of the fin via the window opening, thereby forming a localized buried dielectric layer in the bottom region of the fin.

20 Claims, 13 Drawing Sheets

(56) References Cited

U.S. PATENT DOCUMENTS

| | | |
|---|---|---|
| 6,362,070 B1* | 3/2002 | Villa et al. ............... 438/404 |
| 2001/0042871 A1 | 11/2001 | Noble |
| 2002/0076864 A1 | 6/2002 | Tseng |
| 2002/0094665 A1 | 7/2002 | Villa et al. |
| 2004/0157401 A1 | 8/2004 | Seo |
| 2004/0262676 A1 | 12/2004 | Lee et al. |
| 2005/0029619 A1* | 2/2005 | Forbes ..................... 257/516 |
| 2007/0158756 A1* | 7/2007 | Dreeskornfeld et al. ..... 257/374 |
| 2009/0206405 A1 | 8/2009 | Doyle et al. |
| 2010/0133647 A1 | 6/2010 | Kim et al. |
| 2010/0230757 A1 | 9/2010 | Chen et al. |
| 2012/0086053 A1* | 4/2012 | Tseng et al. ............. 257/288 |

OTHER PUBLICATIONS

European Search Report, EP Patent Application No. EP11152112.6 dated Mar. 26, 2012.

* cited by examiner

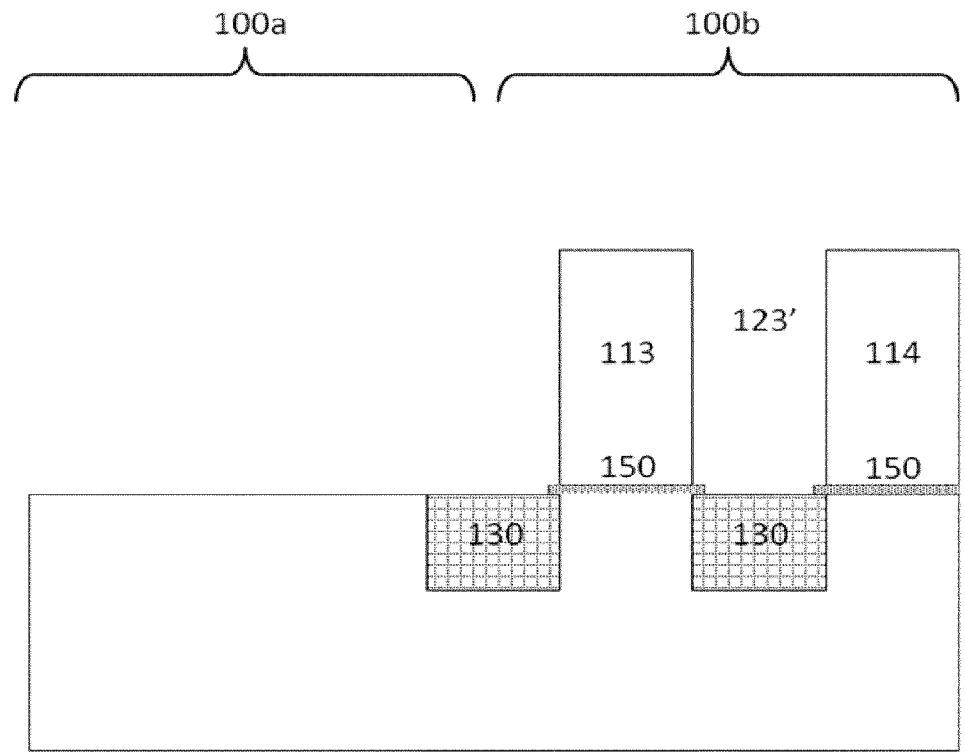
FIG. 12
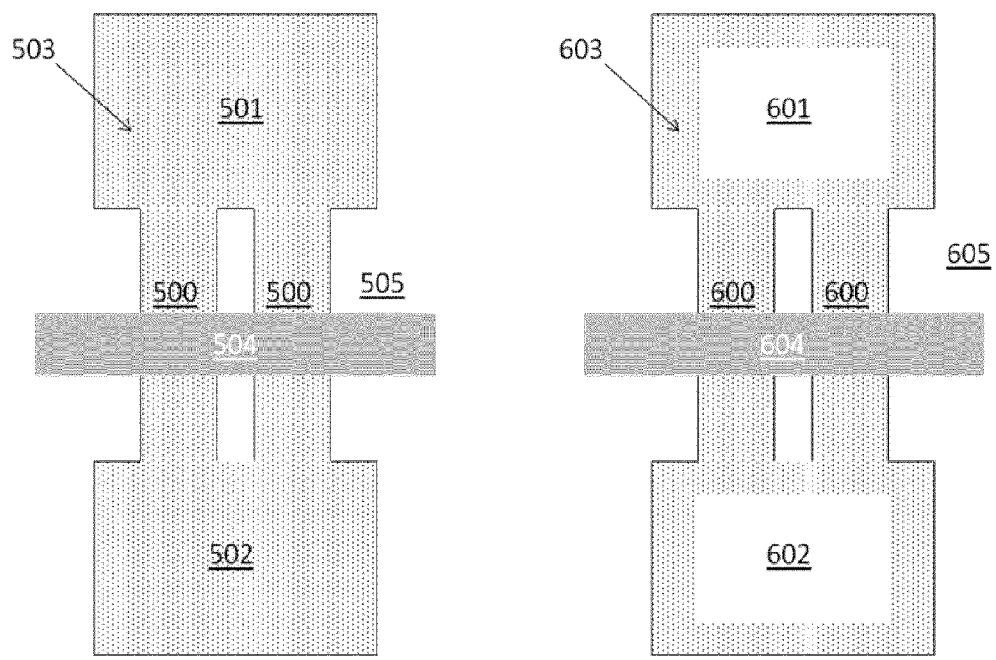
FIG. 13A
FIG. 13B

METHOD FOR FORMING A BURIED DIELECTRIC LAYER UNDERNEATH A SEMICONDUCTOR FIN

CROSS REFERENCE TO RELATED APPLICATIONS

The present application is a national stage entry of PCT/EP2011/070273, filed Nov. 16, 2011, which claims priority to U.S. Provisional Patent Application Ser. No. 61/415,302, filed Nov. 18, 2010. The full disclosures of U.S. Provisional Patent Application Ser. No. 61/415,302 and PCT/EP2011/070273 are hereby incorporated herein by reference.

FIELD OF THE INVENTION

The present invention is related to methods for manufacturing semiconductor devices and the semiconductor devices made thereof.

More particularly the present invention is related to methods for manufacturing floating (body) gate semiconductor devices and the floating (body) gate semiconductor devices made thereof.

The present invention is also related to methods for forming a hybrid semiconductor substrate.

More particularly the present invention is related to methods for forming a hybrid semiconductor substrate with a bulk region and a semiconductor-on-insulator (SOI) region.

The present invention is also related to methods for combining semiconductor-on-insulator devices (SOI devices) with semiconductor bulk devices.

BACKGROUND OF THE INVENTION

In current state of the art the use of semiconductor-on-insulator (SOI) wafers or substrates is widely known for the integration of semiconductor devices as it has a superior scalability and good performance. However the use of SOI wafers also involves different drawbacks. SOI wafers are very expensive. Moreover, due to the buried oxide layer, many devices cannot be built easily on a SOI substrate. For sub-32 nm technology node, the buried oxide layer thickness is less than 20 nm. The integration of, for example, periphery devices on SOI substrates may form a problem due to the intrinsically low breakdown voltage in thin-body SOI.

There is a need for hybrid semiconductor substrates whereupon both SOI devices and bulk semiconductor devices may be integrated together.

For NAND flash memory devices, the physical scaling as well as the electrical scaling has become more challenging with each technology node.

In state-of-the-art NAND flash memory devices, the ONO (oxide-nitride-oxide) interpoly dielectric runs along the sidewalls of the floating gate in order to provide a large capacitance between floating gate and control gate and therefore a large coupling ratio. As the IPD layer is present twice in a floating gate flash device, scaling of thickness of the IPD layer becomes a limiting factor for flash scaling below a 2X generation technology node. To achieve good data retention, the thickness of the IPD layer is limited to about 12 to 15 nm using state-of-the art materials, which means already 24 to 30 nm pitch size at least, as it is still necessary to add the thickness of the floating gate and the control gate.

FIG. 1 shows a schematic representation of a state-of-the-art floating gate memory device on a substrate 1, comprising floating gate structures 2, isolation areas 3, interpoly dielectric layer 4, tunnel oxide layers 5 and control gate 6. It is seen that the scaling of the pitch P of floating gate memory device becomes a great challenge as it is necessary within the pitch P to have room for the floating gate (FG) 2, for an interpoly dielectric (IPD) layer 4, for a control gate (CG) 6 and for an interpoly dielectric (IPD) layer 4 (again). With the materials currently used for the IPD layer, i.e. ONO or AlO-based dielectric stack, the thickness of the IPD layer is limited to about 12 to 15 nm in order to achieve good data retention for the memory device. When scaling to smaller thickness, the electrical properties of the materials currently used for the IPD layer are not good enough anymore since smaller thickness causes increased leakage and bad performance of the device.

In order to improve the quality and scalability of the IPD layer there is a need for other materials. One possibility is the use of monocrystalline silicon (c-Si) for the floating gate which gives the opportunity to use thermal oxide grown on the c-Si floating gate as IPD layer. The concept of using a monocrystalline floating gate and thereupon a thermally grown oxide as IPD layer has been reported in the JP patent JP2668707 B2.

A possibility to integrate a c-Si floating gate is by using a semiconductor-on-insulator (SOI) substrate. The top silicon layer of the SOI substrate is then used as floating gate layer, which implies that the buried oxide of the SOI substrate is used as tunnel dielectric layer and the underlying bulk silicon is used as transistor channel.

However, as stated above, SOI wafers are expensive and the buried oxide layer of an SOI wafer is too thick to be used as tunnel oxide, thus it needs further thinning.

There is a need for floating gate memory devices with a good data retention and electrical performance, which are scalable below 3X generation technology node, and even scalable below 2X generation technology node.

SUMMARY OF THE INVENTION

The present invention is related to methods and products and/or devices as disclosed in the appended claims.

The method is thus related firstly to a method for forming a buried dielectric layer underneath a semiconductor fin, said method comprising the steps of:
  Providing a bulk semiconductor substrate,
  Producing at least two trenches in the substrate, to thereby form at least one fin between said trenches, or a plurality of fins separated by said trenches,
  Filling said trenches with an insulating material,
  Partially removing said insulating material in each of said trenches so that a portion of said insulating material remains at the bottom of each of said trenches, forming isolation regions in each of said trenches,
  Depositing a liner at least on the sidewalls of said trenches,
  Removing a layer from the top of each of the isolation regions, to thereby form a window opening at the sidewalls of a bottom region of the fin(s),
  transforming the semiconductor material in said bottom region of the fin(s) via said window opening, thereby forming a localized buried dielectric layer in said bottom region, said liner and said isolation region substantially preventing the fin(s) from being transformed in the regions outside said bottom region.

According to a preferred embodiment, transforming the semiconductor material in said bottom region comprises oxidizing the semiconductor material.

Said bulk substrate may be a monocrystalline semiconductor substrate.

Said liner may furthermore be deposited on top of the isolation region in each of said trenches. In that case, the step of removing a layer from the top of each of the isolation regions is preceded by the step of removing the liner from the top of said isolation regions.

The method may further comprise after the step of partially removing the insulating material and before the step of depositing a liner: the step of depositing a protection layer on the sidewalls of the trenches.

According to a preferred embodiment, said buried dielectric layer has an equivalent oxide thickness of less than 10 nm.

Preferably, the breakdown field of said buried dielectric layer is larger than 17 mV/cm and the oxide trap density is less than 6e15 $cm^{-3}$.

According to one embodiment, a bulk region and an Semiconductor-on-Insulator (SOI) region are defined on the substrate surface, and said trenches are formed in said SOI region, so that one of said trenches forms the separation between the bulk region and the SOI region.

Another embodiment of the method further comprises the steps of providing a gate dielectric layer at the top surface and sidewall surfaces of the fin(s) and of providing a conductive layer over the fin(s) and the gate dielectric layer, to thereby form a floating gate semiconductor memory device, said buried dielectric layer acting as the tunnel dielectric layer.

When the substrate is a monocrystalline substrate, said gate dielectric layer is preferably provided by thermal oxidation of the top surfaces and sidewall surfaces of the fin(s).

The invention is equally related to a finfet based semiconductor device comprising:

At least one semiconductor fin on a semiconductor substrate, the at least one semiconductor fin comprising a buried dielectric layer at the bottom of the fin;

A source and drain region in contact with the at least one semiconductor fin, the source and drain region comprising a buried dielectric later at the bottom and in an outer portion of the source and drain region and, A conductive gate electrode running perpendicular over the at least one semiconductor fin.

According to an embodiment, the semiconductor device is a floating gate semiconductor memory device, wherein the conductive gate electrode serves as the control gate of the memory device, wherein the semiconductor fin serves as the floating gate of the semiconductor device and wherein the buried dielectric layer serves as the tunnel dielectric layer of the memory device.

Certain inventive aspects relate to methods for manufacturing semiconductor devices and the semiconductor device made thereof. More particularly the present invention relates to methods for manufacturing floating gate semiconductor memory devices and floating gate semiconductor memory devices made thereof. More specifically the present invention relates to methods for manufacturing monocrystalline floating gate semiconductor memory devices and monocrystalline floating gate semiconductor memory devices made thereof.

It is an advantage of certain inventive aspects that scaling of a semiconductor memory device can be done down to 1X generation technology node.

It is an advantage of certain inventive aspects that more specifically for a floating (body) gate semiconductor memory device, the IPD layer may be scaled down to less than 10 nm.

It is an advantage of certain inventive aspects that locally a SOI-like structure may be formed with a very thin buried oxide layer (acting as a tunnel oxide layer), i.e a tunnel oxide layer with an EOT thickness lower than 10 nm.

It is an advantage of certain inventive aspects that a localized SOI structure may be formed with a high quality buried oxide layer. With high quality is meant a buried oxide with low defect level, in other words with a minimum of physical defects. A defect level which is comparable to the defect level of a thermal silicon oxide may be achieved. It is an advantage that a localized buried dielectric layer may be formed with a breakdown field larger than 17 mV/cm and/or with an oxide trap density less than 6e15 $cm^{-3}$ considering less than 1% failures after 10 years.

Certain inventive aspects also relate to methods for forming a localized SOI active region.

Certain inventive aspects also relate to a hybrid semiconductor substrate which comprises a bulk semiconductor active region and which comprises a localized SOI active region. As such, bulk semiconductor devices may be combined with SOI semiconductor devices on one semiconductor substrate. The bulk semiconductor devices are manufactured in the bulk semiconductor active region and the SOI semiconductor devices are manufactured in the localized SOI active region.

Certain inventive aspects also relate to methods for manufacturing such a hybrid semiconductor substrate, more specifically a hybrid SOI/bulk semiconductor substrate.

It is an advantage of certain inventive aspects that SOI semiconductor devices may be combined with bulk semiconductor devices using one common substrate or wafer. For example SOI finfet-based semiconductor devices may be combined with bulk finfet-based semiconductor devices using one common substrate or wafer.

It is an advantage of certain inventive aspects that low cost substrates may be used for integrating SOI semiconductor devices with bulk semiconductor devices It is an advantage of certain inventive aspects that a simplified fabrication process may be applied for hybrid SOI/bulk semiconductor devices It is an advantage of certain inventive aspects that a localized SOI structure may be formed using a very thin tunnel oxide.

It is an advantage of certain inventive aspects that a localized SOI structure may be formed with a well controlled oxide thickness.

BRIEF DESCRIPTION OF THE FIGURES

FIGS. 2 to 12 illustrate different embodiments for methods for forming a localized SOI active region, more specifically for methods for manufacturing a hybrid semiconductor substrate, more specifically a hybrid SOI/bulk semiconductor substrate.

FIG. 13A shows a schematic top view of a multigate semiconductor device manufactured on an SOI substrate, according to the prior art.

FIG. 13B shows a schematic top view of a multigate semiconductor device manufactured according to embodiments of the present invention, i.e. by providing a localized buried dielectric layer.

DETAILED DESCRIPTION OF CERTAIN INVENTIVE ASPECTS

Figure 1:
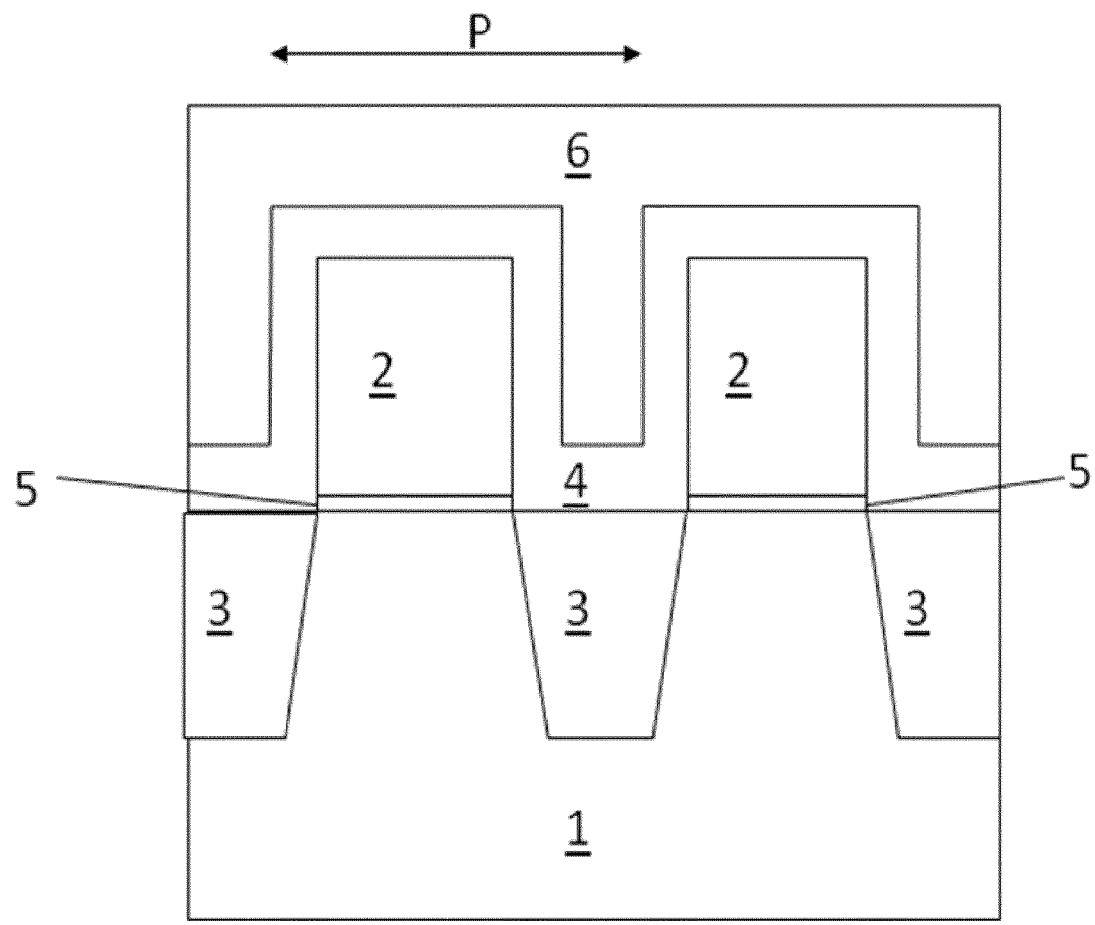
FIG. 1 illustrates a schematic representation of a non-volatile semiconductor memory device according to the prior art, more specifically a floating gate semiconductor memory device.
Figure 2:
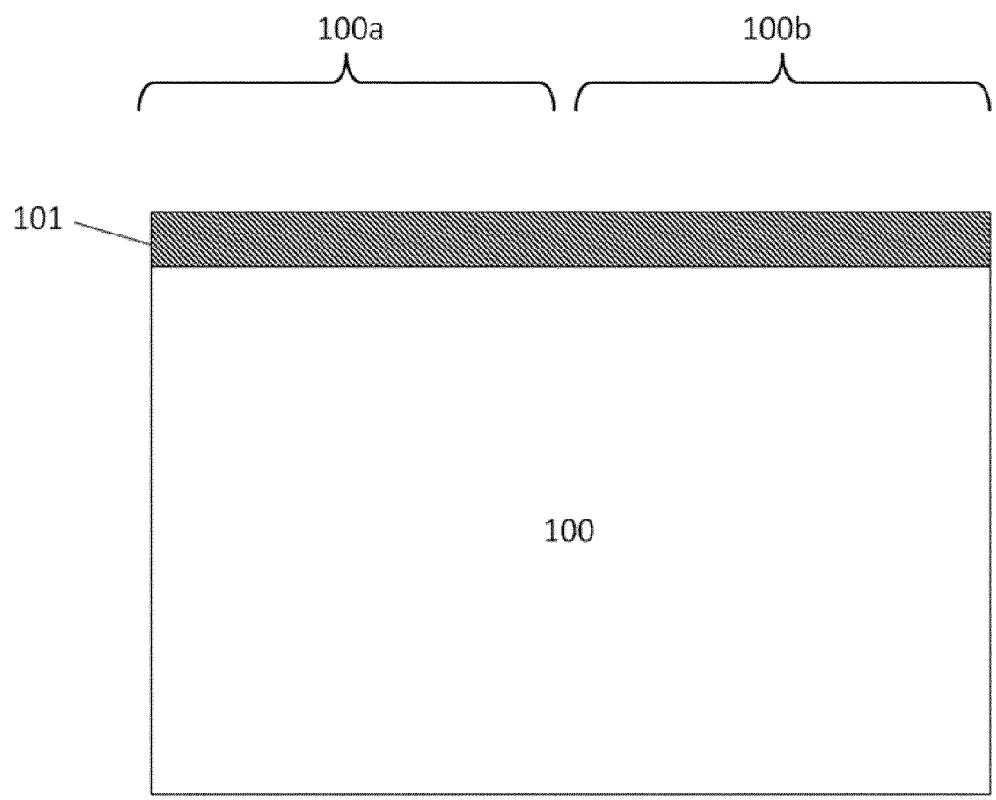

One or more embodiments of the present invention will now be described in detail with reference to the attached figures, while the invention is not limited thereto. The drawings described are only schematic and are non-limiting. In the drawings, the size of some of the elements may be exaggerated and not drawn on scale for illustrative purposes. Those skilled in the art can recognize numerous variations and modifications of this invention that are encompassed by its scope. Accordingly, the following description of certain inventive embodiments should not be deemed to limit the scope of the present invention.

Furthermore, the terms first, second and the like in the description and in the claims are used for distinguishing between similar elements and not necessarily for describing a sequential or chronological order. It is to be understood that the terms so used are interchangeable under appropriate circumstances and that the embodiments of the invention described herein are capable of operation in other sequences than described or illustrated herein.

It is to be noticed that the term "comprising", used in the claims, should not be interpreted as being restricted to the means listed thereafter; it does not exclude other elements or steps. Thus, the scope of the expression "a device comprising means A and B" should not be limited to devices consisting only of components A and B. It means that with respect to the present invention, the only relevant components of the device are A and B.

A first inventive aspect relates to a method for forming a hybrid semiconductor substrate, more specifically a hybrid SOI/bulk semiconductor substrate. The hybrid semiconductor substrate formed according to a first inventive aspect comprises thus a localized SOI region and a bulk region.

The method for forming a hybrid semiconductor substrate comprises:
providing a bulk semiconductor substrate;
defining a bulk region and an SOI region in the bulk semiconductor substrate;
providing a semiconductor pillar in the SOI region; the semiconductor pillar having a bottom region and a sidewall surface;
forming a buried oxide layer in the bottom region of the semiconductor pillar;
providing an isolation region between the bulk region and the SOI region and at both sides of the semiconductor pillar.

Embodiments for the method for forming a hybrid semiconductor substrate will now be described in more detail with reference to FIG. 2 to FIG. 12.

A bulk semiconductor substrate 100 is provided. The bulk semiconductor substrate 100 may be a crystalline semiconductor substrate. The bulk semiconductor substrate is preferably monocrystalline. For example a (mono) crystalline Si substrate may be provided.

In the bulk semiconductor substrate 100 a bulk region 100a and an SOI region 100b are defined. Whereas no buried oxide layer is present in the bulk semiconductor substrate, a local buried oxide layer will be formed according to embodiments of the first inventive aspect in the SOI region. The process shows how to form a local SOI region in a bulk substrate.

At least one semiconductor pillar 113, 114 is provided (i.e. produced) in the SOI region 100b of the bulk semiconductor substrate. The semiconductor pillar may be formed using conventional techniques known for a person skilled in the art.

Figure 3:
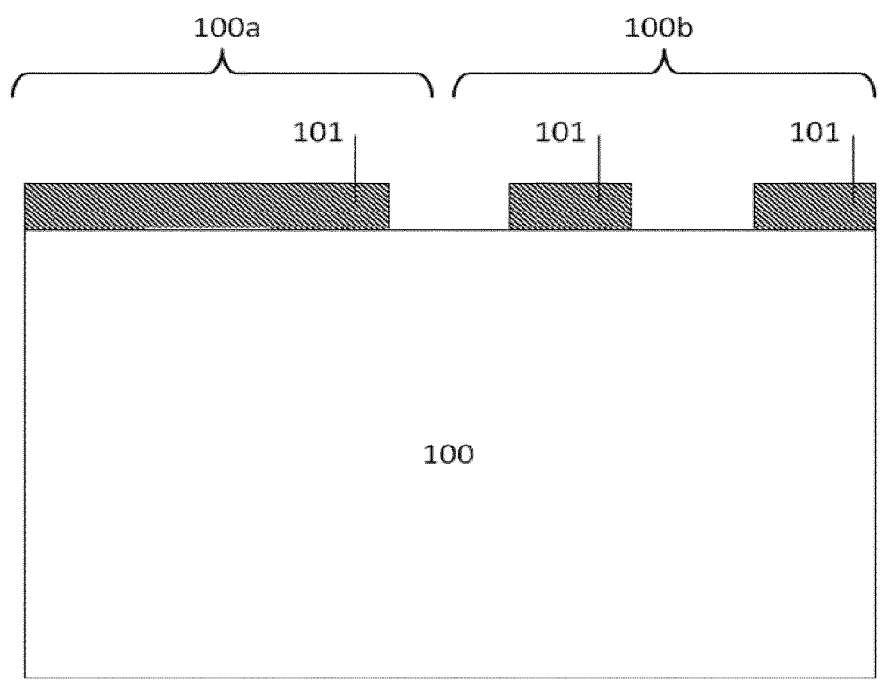

In the embodiment shown in FIGS. 2-12, a hardmask layer 101 is provided on top of the bulk semiconductor substrate 100. The hardmask layer 101 may for example include a nitride layer, an oxide layer or a combination made thereof. Next the hardmask layer 101 is patterned (FIG. 3) in the SOI region 100b. Using lithographic techniques, a photoresist material (not shown) is applied on top of the hardmask layer 101, exposed, developed and etched. Next the underlying hardmask layer 101 is etched using the patterned photoresist material as mask. As a result the hardmask layer 101 is patterned in the SOI region, i.e. openings are etched in the hardmask layer thereby exposing the underlying bulk semiconductor substrate 100 in the SOI region 100b (FIG. 3).

By using the patterned hardmask layer 101 as a mask the underlying bulk semiconductor substrate is etched (FIG. 4), thereby forming a series of openings (trenches) 122, 123 in the SOI region 100b of the bulk semiconductor substrate or in other words thereby forming a series of freestanding pillars 113, 114 in the SOI region 100b of the bulk semiconductor substrate. The freestanding pillars may also be referred to as fins.

The freestanding pillars may also be formed for example by using spacer-defined patterning as known for a person skilled in the art.

According to the embodiment shown in the FIGS. 2-12, during the step of forming a semiconductor pillar 113, 114 in the SOI region 100b, the bulk region 100a remains intact. This means that the hardmask layer 101 remains present on the bulk region 100a of the bulk semiconductor substrate. This may for example be interesting when a hybrid bulk/SOI substrate is necessary for combining bulk planar CMOS devices in the bulk region and SOI semiconductor devices in the SOI region.

Alternatively, according to other embodiments, also a semiconductor pillar may be formed in the bulk region using the same technique as in the SOI region. This may for example be interesting when a hybrid bulk/SOI substrate is necessary for combining for example bulk multigate devices in the bulk region and SOI multigate devices in the SOI region.

Forming a semiconductor pillar in the bulk region and in the SOI region may be done simultaneously or in separate process steps.

Possible applications for integrating a localized SOI region in a bulk substrate may be the integration of SOI into system on chip (SOC). For example one may think of the integration of periphery devices such as I/O devices and ESD devices in a bulk region or the integration of bipolar and analog devices in a bulk region of the hybrid substrate together with the integration of logic and/or SRAM devices in the localized SOI region of the hybrid substrate.

Figure 4:
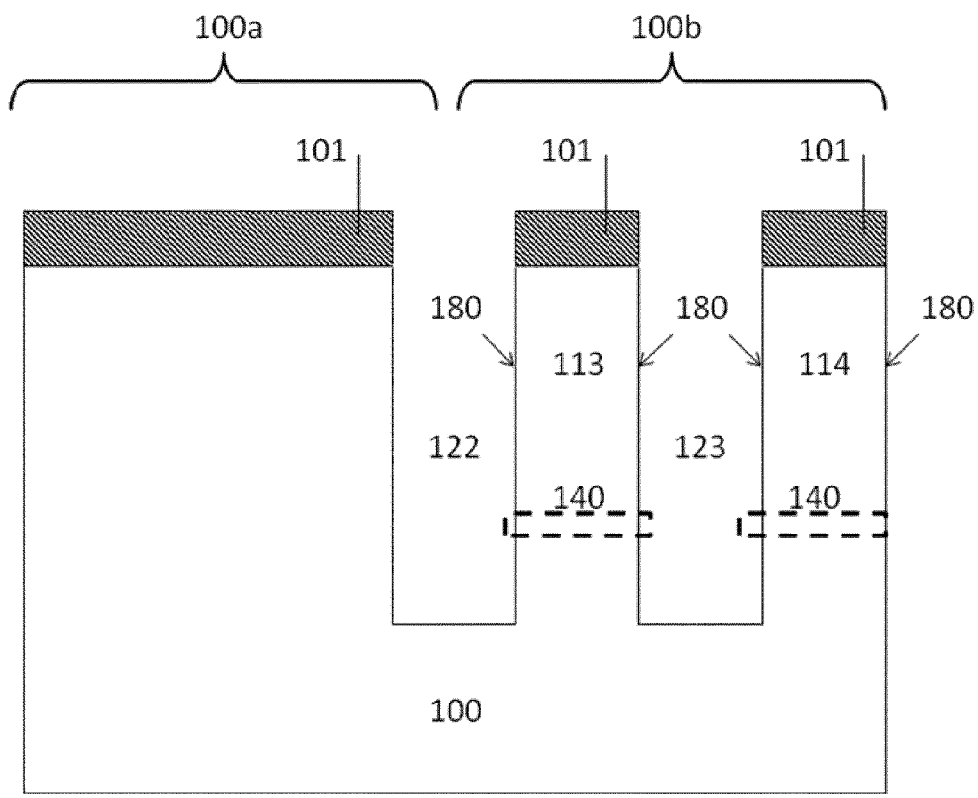
Figure 5:
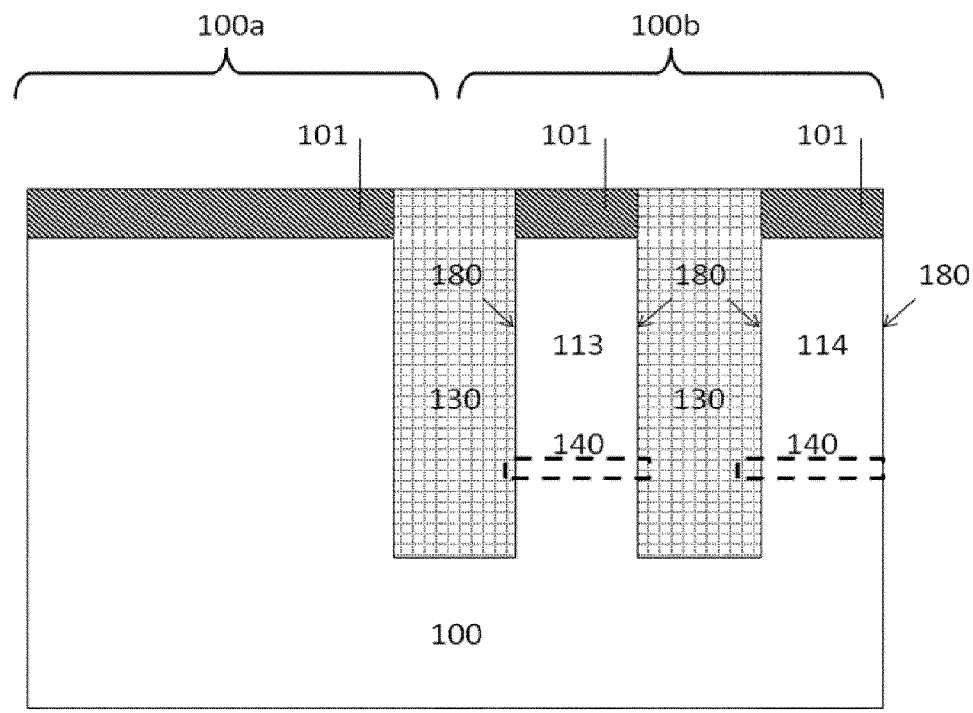

As shown in FIG. 4, the semiconductor pillars 113, 114 comprise a bottom region 140 and a sidewall surface 180.

After providing the semiconductor pillars 113, 114 in the SOI region 100b of the bulk semiconductor substrate a buried dielectric layer is to be formed in the bottom region 140 of the semiconductor pillars. The buried dielectric layer is preferably a buried oxide layer.

The freestanding pillars 113, 114 should be electrically isolated from each other. Also the bulk region 100a and SOI region 100b need to be electrically isolated from each other. Isolating the semiconductor pillars 113, 114 and the bulk region 100a from the SOI region 100b may be done by forming shallow trench isolation regions 130 (STI) in between the semiconducting freestanding pillars 113, 114 and in between the bulk region 100a and SOI region 100b.

Figure 6:
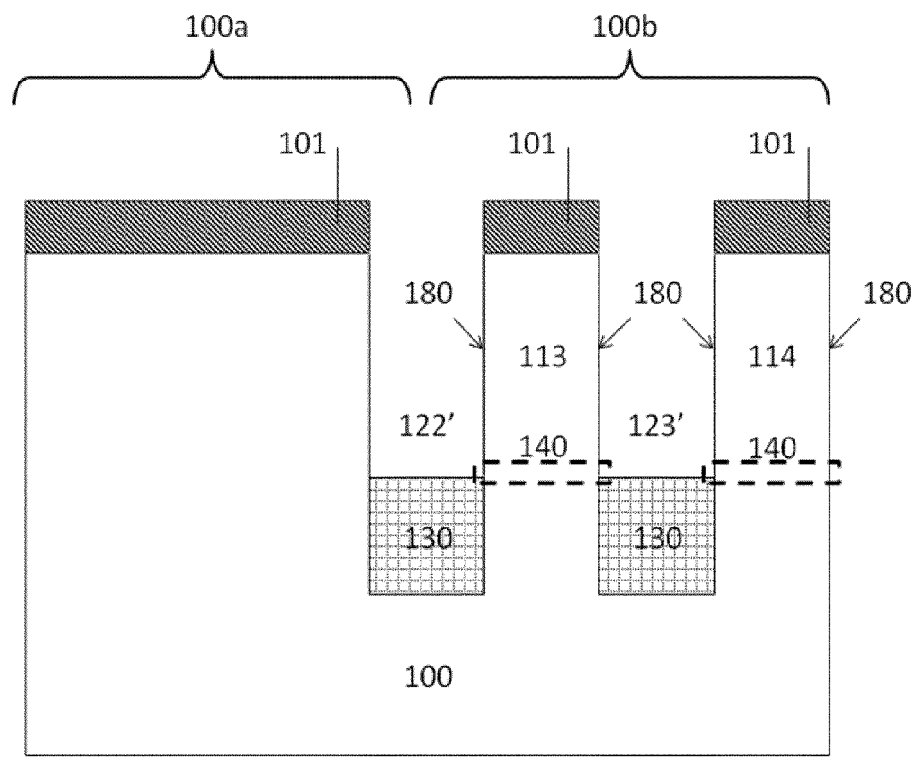

In the embodiment of FIGS. 2-12, this is done by filling the trenches 122, 123 with an insulating material 130 (FIG. 5), followed by a chemical-mechanical planarization step (CMP) to remove the excess insulating material on top of the hardmask layer. Next, part of the insulating material 130 in the trenches 122, 123 is etched such that openings 122', 123' remain in between the pillars and in between the bulk region 100*a* and SOI region 100*b* (FIG. 6). Etching the insulating material may be done for example by dry or wet etching techniques. The insulating material may comprise silicon oxide or any material known for a person skilled in the art for providing STI regions.

To ensure a good electrical isolation between the freestanding pillars 113,114 and between the bulk region 100*a* and SOI region 100*b* respectively the shallow trench isolation regions 130 are preferably deep enough, i.e. for example about 300 nm.

Figure 7:
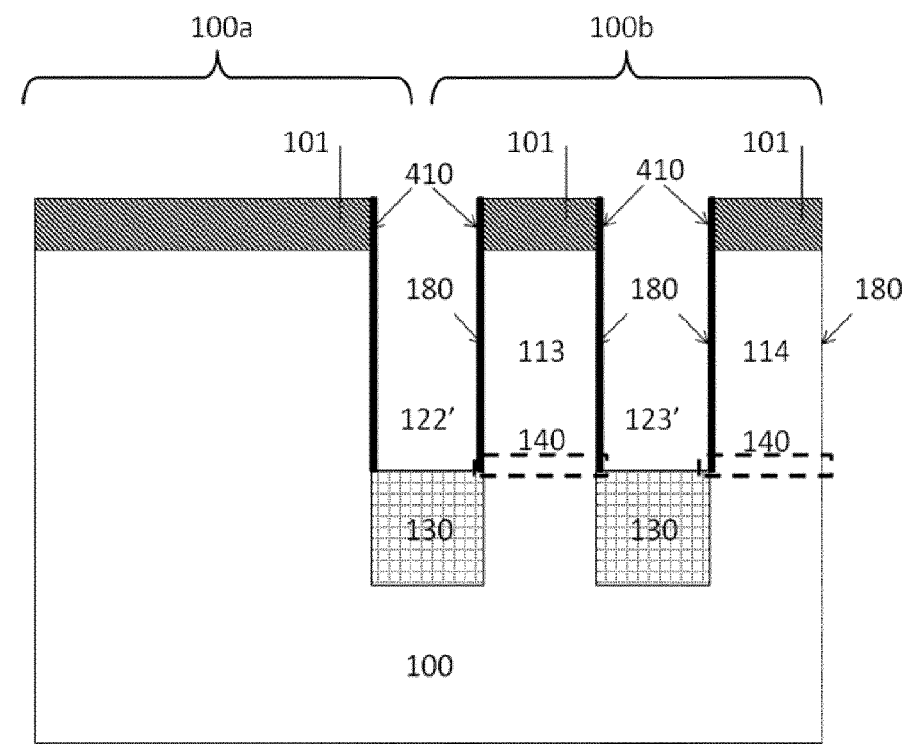
Figure 8:
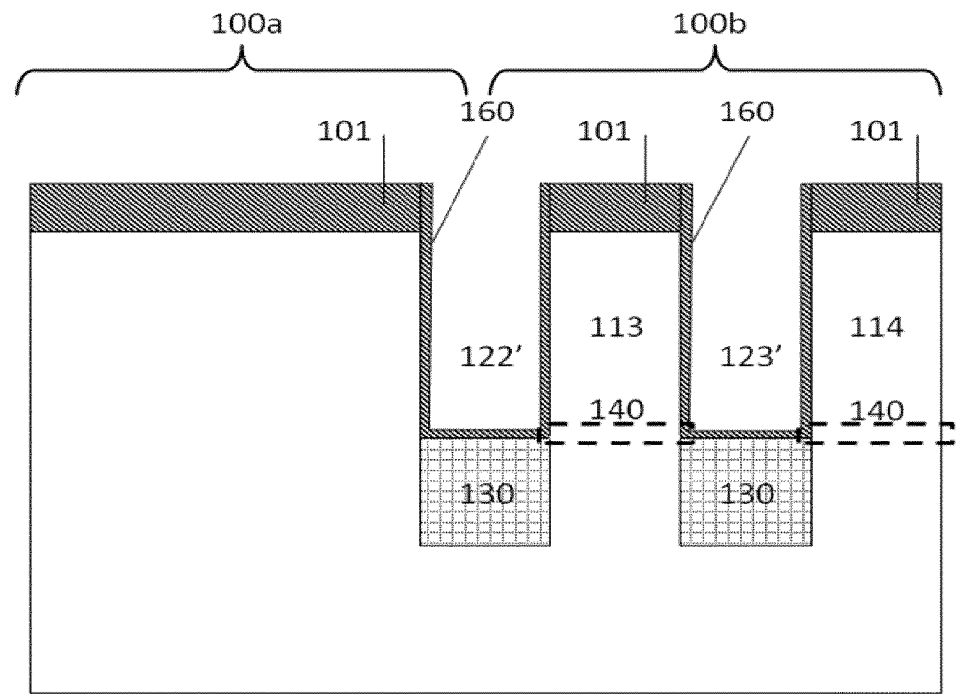

After providing the STI regions 130 a thin layer (less than 2 nm, preferably less than 1 nm) of chemical oxide 410 (chemox) may be grown optionally on the sidewall surfaces 180 of the pillars 113, 114 (FIG. 7). This chemical oxidation layer may serve as a protection layer of the semiconductor pillars 113, 114 during the following process steps.

In order to form a localized SOI region in the bulk semiconductor substrate a dielectric layer must be provided at the bottom region 140 of the semiconductor pillar 113, 114 in the SOI region 100*b*. In the bulk region 100*a* no dielectric layer is provided. The localized SOI region is formed by forming a buried dielectric layer in the bottom region 140 of the semiconductor pillar 113, 114.

According to the invention, forming the buried dielectric layer in the bottom region 140 of the semiconductor pillar 113, 114 is done by transforming the semiconductor material in the bottom region 140 of the semiconductor pillar 113, 114 into a dielectric material. The dielectric material is preferably an oxide material. If the semiconductor material of the bulk semiconductor substrate and thus of the semiconductor pillar for example comprises silicon, transforming the semiconductor material in the bottom region 140 of the semiconductor pillar 113, 114 comprises oxidizing the silicon (Si) in the bottom region of the semiconductor pillar to form silicon oxide ($SiO_x$).

In order to make sure only the bottom region 140 of the semiconductor pillar 113, 114 is transformed into a buried dielectric layer, the other parts (above the bottom region) should be shielded from being transformed or oxidized.

Therefore a liner 160 is provided along the sidewall surface 180 of the semiconductor pillar 113, 114 (FIG. 8) thereby leaving a first cavity 123' in between the semiconductor pillars and a second cavity 122' between the bulk region 100*a* and the SOI region 100*b*. The liner 160 may comprise an oxidation resistive material such as for example a layer comprising nitride (for example TiN, SiN) or a layer comprising oxide (for example AlO). The liner 160 comprises a material which can prevent transformation (e.g. oxidation) of the underlying material, i.e. the semiconductor pillar 113, 114. The liner 160 may consist of the same material as the hardmask layer 101. The liner 160 has a thickness in the range 5 to 10 nm. The liner 160 may be deposited using a thin film deposition technique such as for example low-pressure chemical vapor deposition. The liner 160 may also be provided on top of the isolation regions 130 at the bottom of the trenches 122, 123. Other deposition techniques as known for a person skilled in the art may be possible for the formation of the liner 160 such as for example ALD. The liner 160 is preferably a conformal liner along the sidewall surface 180 (with or without the optional chemox layer 410) of the semiconductor pillar 113, 114.

Figure 9:
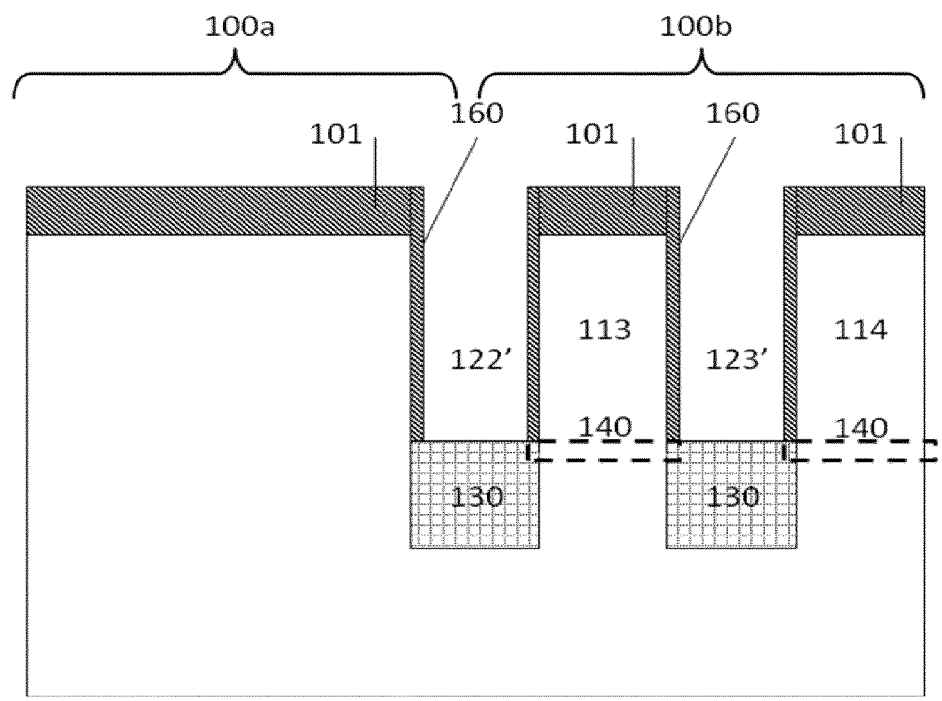

After providing the liner 160, part of the liner 160 which is present on top of the isolation regions 130 at the bottom of the cavities 122', 123' is removed (FIG. 9). Removing this part of the liner 160 may be done with suitable etching techniques known for a person skilled in the art such as for example with a dry etching step. This step is of course unnecessary when the liner is deposited only on the sidewall surface 180 and not on the isolation regions 130.

Figure 10:
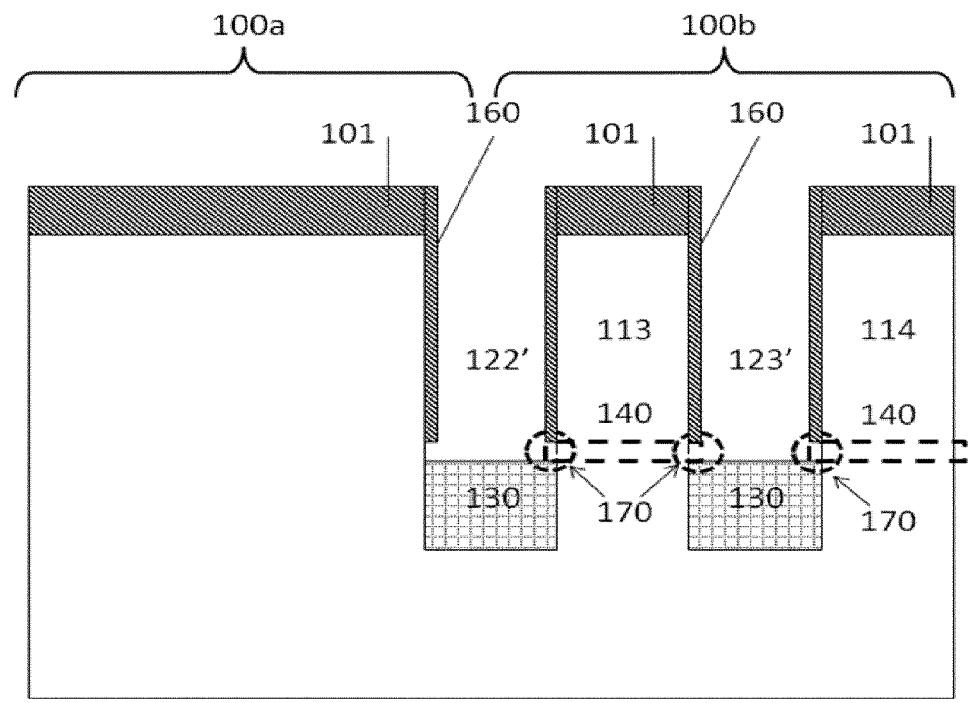

After removing (if necessary) part of the liner, a top layer of the isolation regions 130 is removed. In the embodiment of FIGS. 2-12, an isotropic etch step is used to remove part (i.e. said top layer) of the isolation region 130 thereby creating a window opening 170 at the sidewall of the bottom region 140 of the semiconductor pillar 113, 114, as such exposing part of the semiconductor pillar at the bottom region 140 (FIG. 10). In order to keep the semiconductor material 170 in the bottom region 140 of the semiconductor pillar 113, 114 substantially intact, a selective etching process is used as known for a person skilled in the art such as for example a dry or wet oxide etch. During this removal step or etching step damage to the semiconductor material in the bottom region 140 of the semiconductor pillars 113, 114 should be minimized. Underetching of the semiconductor pillars 113, 114 should be minimized.

Removing part of the liner 160 which may be present on top of the isolation regions 130 at the bottom of the cavities 122', 123' and removing part of isolation region 130 may be done simultaneously or in separate etching process steps. By etching part of the (shallow trench) isolation region 130, a window opening 170 is created at the bottom region 140 of the semiconductor pillar 113, 114. The width of the window opening 170 at the bottom region 140 of the semiconductor pillar 113, 114 is thus controlled by the etching step of the (shallow trench) isolation region 130 and depends on the etching parameters, such as type of etchant and duration of etching or etching speed. A HF diluted etch is one example to etch part of the isolation region. The window opening 170 will further define the thickness of the localized buried oxide layer which will be formed at the bottom region 140 of the semiconductor pillar 113, 114.

The semiconductor material in the bottom region 140 of the semiconductor pillar 113,114 may be transformed into a dielectric material by oxidizing the semiconductor material via the window opening 170 formed at the sidewall surface of the bottom region 140 of the semiconductor pillar 113, 114. A selective oxidation step is preferably used such that only the semiconductor material in the bottom region 140 of the semiconductor pillar 113, 114 is transformed (FIG. 11), as such forming a localized buried dielectric layer 150.

The selective oxidation step may for example comprise in-situ steam oxidation or wet oxidation or a high temperature decoupled plasma oxidation. The oxidation parameters should be controlled such that the semiconductor material in the bottom region 140 of the semiconductor pillar 113, 114 is oxidized over the whole length. The semiconductor material from the bottom region 140 of the semiconductor pillar 113, 114 is oxidized starting from the window openings 170 at both sides of the pillar and oxidizing towards the middle of the semiconductor pillar. The selective oxidation of the semiconductor material in the bottom region of the semiconductor pillar must be controlled such that substantially the semiconductor material of the other part of the semiconductor pillar or of the bulk semiconductor substrate in the SOI region remains unchanged, i.e. does not oxidize or transform into a dielectric material.

Depending on the application of the SOI region 100*b*, the thickness of the formed buried dielectric layer 150 may be controlled by creating a larger or smaller window opening 170 at the bottom region 140 of the semiconductor pillar 113, 114.

The equivalent oxide thickness (EOT) of the buried dielectric layer may range from a few nanometers up to a few hundreds of nanometers depending on the purpose of the buried dielectric layer.

According to embodiments the buried dielectric layer has an equivalent oxide thickness (EOT) of about 10 nm or smaller and serves as a tunnel dielectric layer, such as typically used in floating gate memory devices. The buried dielectric layer is preferably a high quality tunnel dielectric layer. The quality of the buried tunnel dielectric layer should equal the quality of a thermal oxide layer with a low density of defects and with a high breakdown voltage. With high quality tunnel oxide layer is meant a dielectric layer which has a high breakdown voltage. This means the high quality tunnel oxide traps fewer charges and as a consequence it takes a long time before breakdown of the tunnel oxide layer. The breakdown field is preferably larger than 17 mV/cm. The oxide trap density is preferably less than 6e15 cm-3 considering less than 1% failures after 10 years.

The bottom region 140 of the semiconductor pillar 113, 114 is thus oxidized from two sides of the semiconductor pillar, i.e. via the window opening 170 at both sides of the semiconductor pillar.

Figure 11:
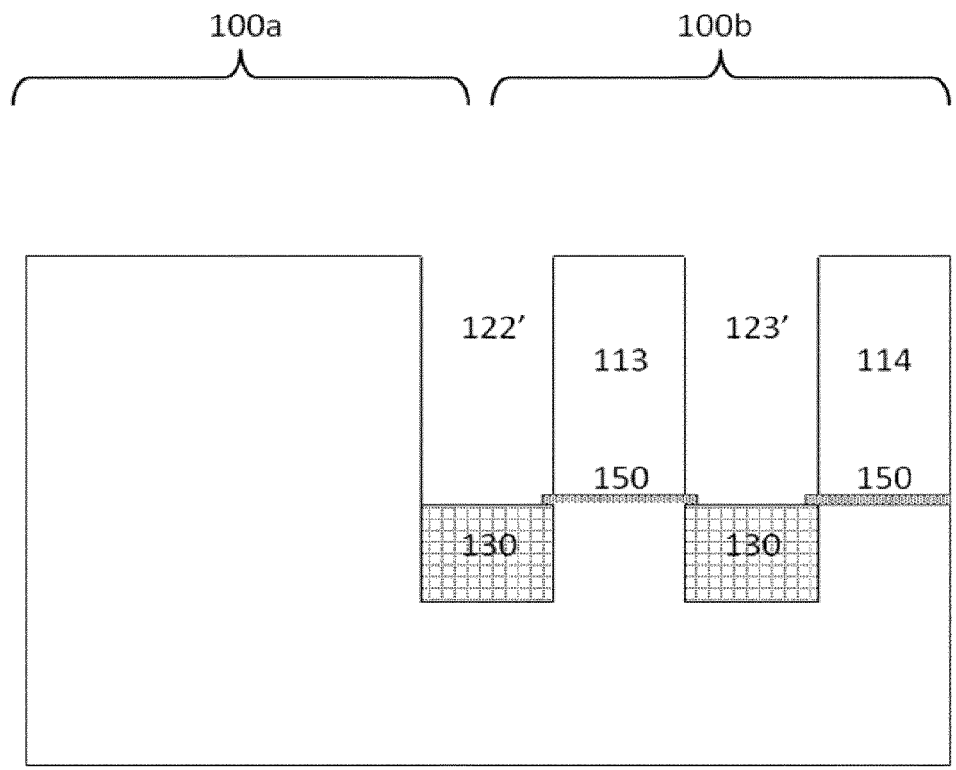

FIG. 11 gives a schematic representation of a hybrid semiconductor substrate according to embodiments of the present invention, the hybrid semiconductor substrate comprising a bulk region 100a and an SOI region 100b. The SOI region 100b comprises at least one pillar 113, 114 with a buried dielectric layer 150 at the bottom of the pillar 113, 114. In between each pillar 113, 114 and in between at least one pillar 113 and the bulk region 100a isolation regions 130 are present. Also shallow trench isolation 130 is provided in between the bulk region 100a and the SOT region 100b and in between the semiconductor pillars 113, 114.

The bulk region 100a may be further processed depending on the application which will be applied in that region. For example in case non-planar semiconductor devices need to be manufactured in the bulk region 100a, fins will be provided in that bulk region 100a and further processed. For example in case planar semiconductor devices need to be manufactured in the bulk region 100a, part of the semiconductor substrate may be etched (FIG. 12) and further planar semiconductor processing may be provided.

Another inventive aspect relates to the use of a hybrid semiconductor substrate manufactured according certain embodiments.

Another inventive aspect relates to a semiconductor memory device, more preferably a floating gate semiconductor memory device and the methods for manufacturing such a device.

The method for manufacturing a semiconductor device comprises:
providing a semiconductor substrate
providing at least one fin in said semiconductor substrate, the fin having a sidewall surface, a top surface and a bottom region;
providing an isolation region aside of the fin;
providing a gate dielectric layer at the top surface and sidewall surface of the fin;
providing a buried tunnel dielectric layer in the bottom region of the fin;
providing a conductive layer over the fin and the gate dielectric layer.

A localized SOI substrate as manufactured according to certain inventive aspects represents an improvement over the known SOI substrates for the manufacturing of a floating gate semiconductor memory device.

Embodiments for manufacturing a floating gate semiconductor memory device will now be described in more detail with reference to FIG. 14 to FIG. 24.

Figure 14:
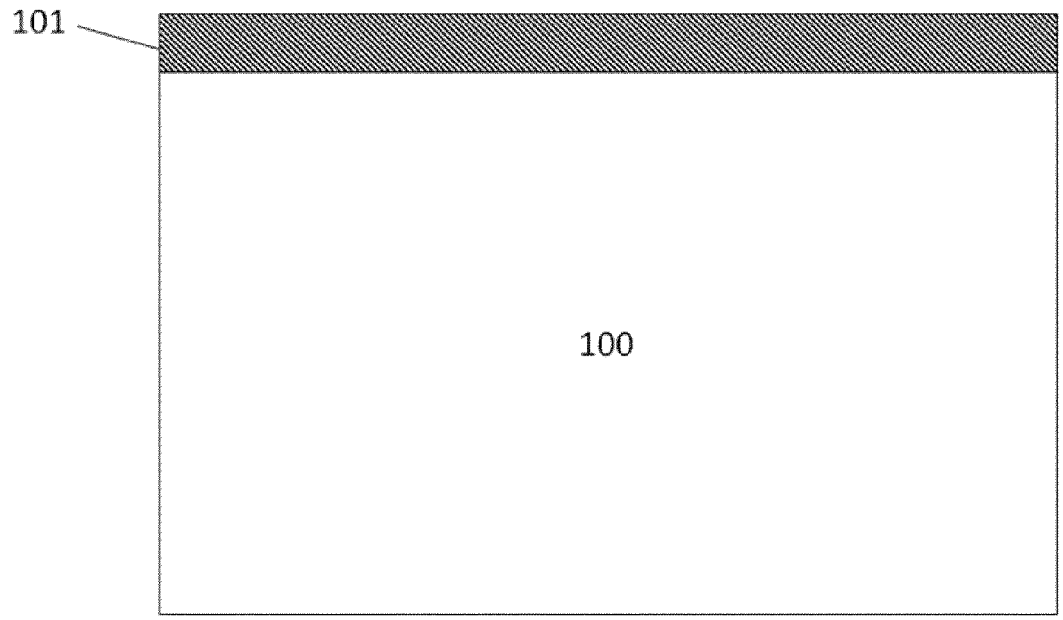
FIGS. 14 to 24 illustrate different embodiments for methods for manufacturing floating gate semiconductor memory devices.

The starting material is a semiconductor substrate 100 (FIG. 14). The semiconductor substrate may be a crystalline semiconductor substrate. The substrate is preferably monocrystalline. For example a (mono) crystalline Si substrate may be provided.

Figure 16:
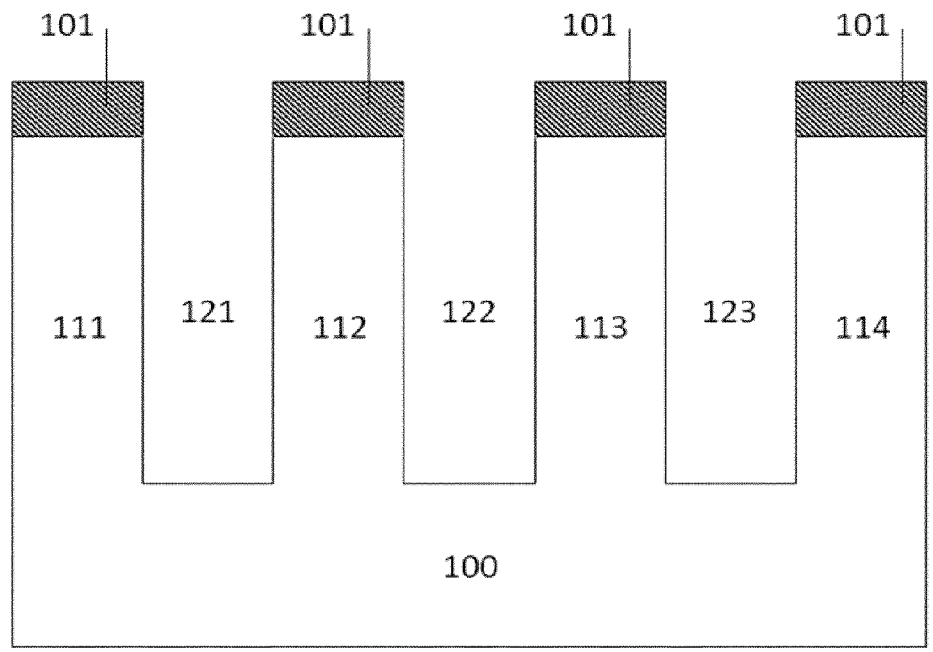
Figure 17:
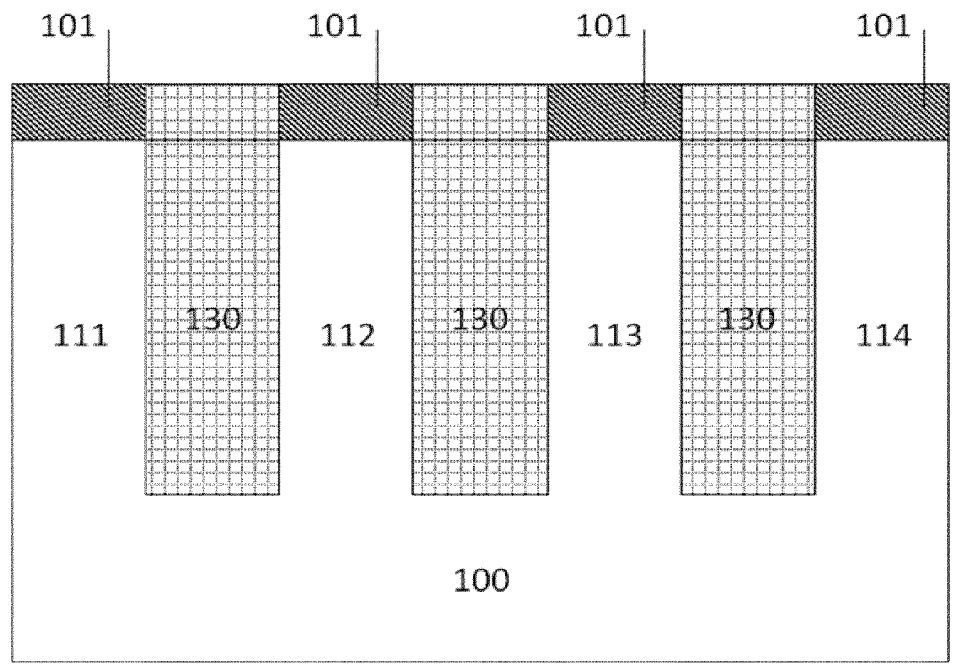

At least one freestanding pillar, also referred to as fin is formed in the semiconductor substrate. FIG. 16 shows schematically a set of four fins 111, 112, 113, 114.

Forming the at least one fin may be done using conventional techniques known for a person skilled in the art.

In the embodiment shown, a hardmask layer 101 is provided on top of the semiconductor substrate 100 (FIG. 14). The hardmask layer 101 may for example include a nitride layer, an oxide layer or a combination made thereof.

Figure 15:
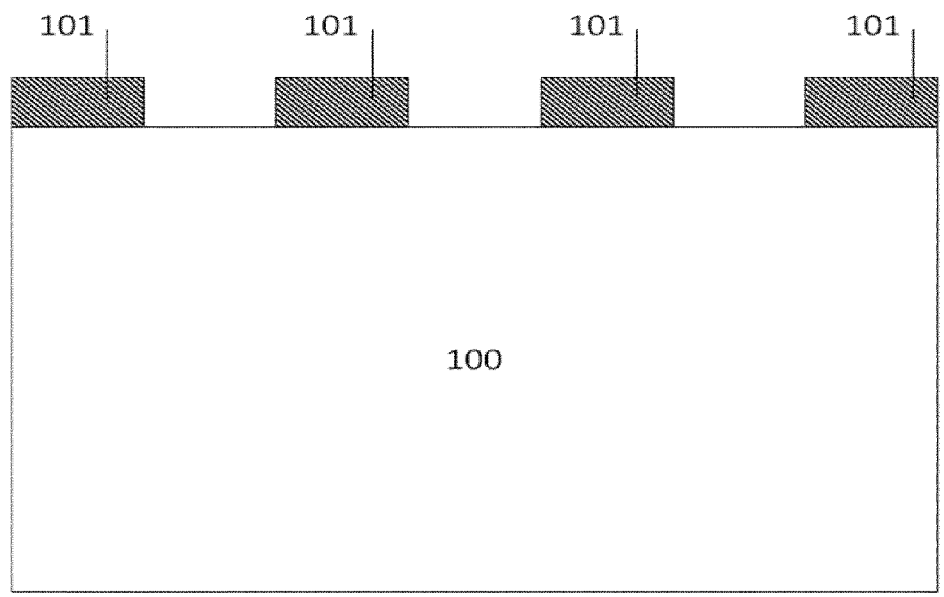

Next the hardmask layer 101 is patterned (FIG. 15). Using lithographic techniques, a photoresist material (not shown) may be applied on top of the hardmask layer, exposed, developed and etched. Next the underlying hardmask layer may be etched using the patterned photoresist material as mask. As a result the hardmask layer is patterned, i.e. openings are etched in the hardmask layer thereby exposing the underlying semiconductor substrate (FIG. 15).

By using the patterned hardmask layer as a mask the underlying semiconductor substrate may be etched (FIG. 16), thereby forming a series of openings (trenches) 121, 122, 123 in the semiconductor substrate or in other words thereby forming a series of fins 111, 112, 113, 114 in the semiconductor substrate.

The freestanding pillars may also be formed for example by using spacer-defined patterning as known for a person skilled in the art.

Depending on the applications and technology node for which the resulting semiconductor devices will be used, the dimensions of the freestanding pillars may differ.

Figure 18:
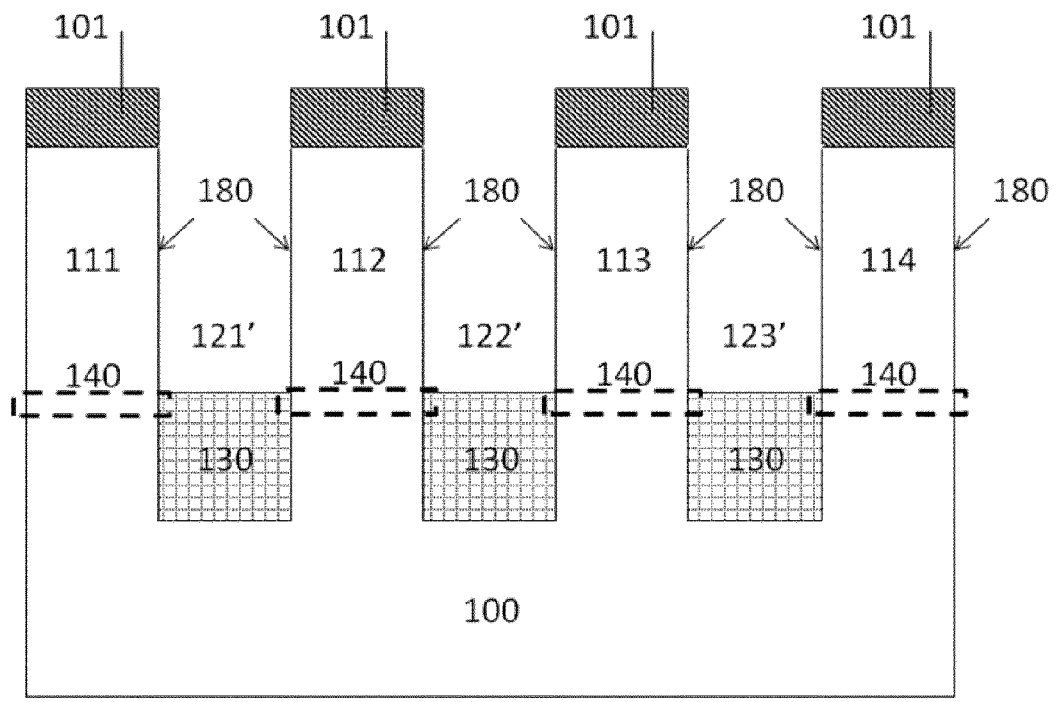
Figure 19:
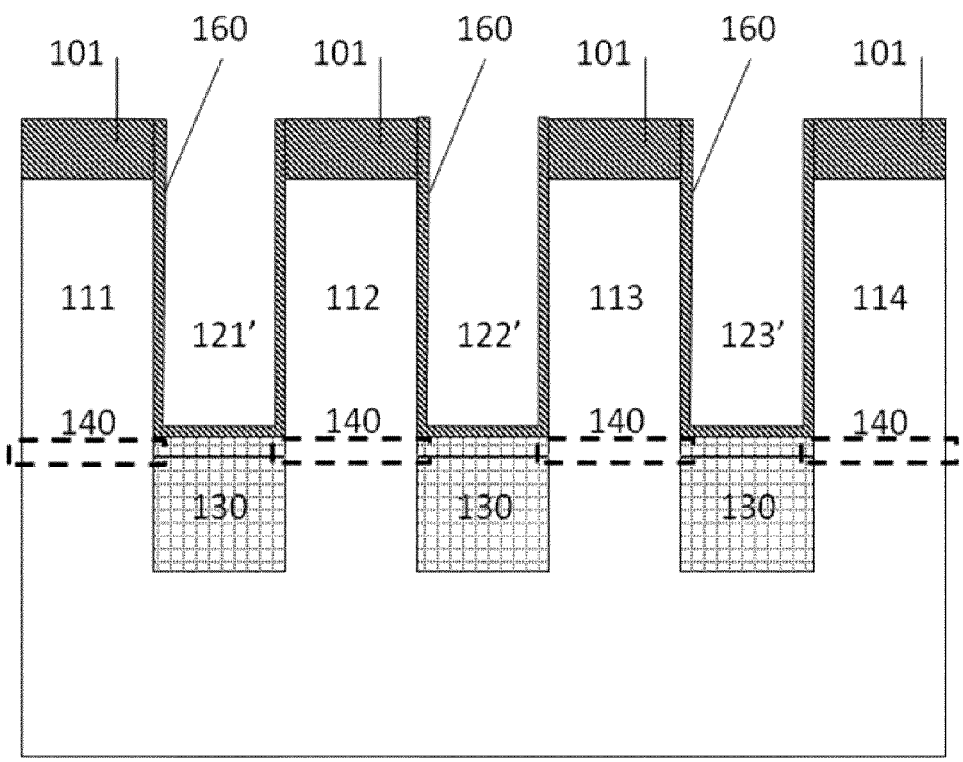

In a next step the fins 111, 112, 113, 114 are electrically isolated from each other by forming shallow trench isolation (STI) regions 130 in between the semiconducting fins. This may be done by partially filling the trenches 121, 122, 123 with an insulating material 130. This may be done by first filling the trenches 121, 122, 123 with an insulating material 130 (FIG. 17), followed by a chemical-mechanical planarization step (CMP) to remove the excess insulating material on top of the hardmask layer. Next, part of the insulating material 130 in the trenches 121, 122, 123 is etched such that openings 121', 122', 123' remain in between the pillars (FIG. 18). Etching the insulating material may be done for example by dry or wet etching techniques. The insulating material may comprise silicon oxide or any material known for a person skilled in the art for providing STI regions. To ensure a good electrical isolation between the fins the shallow trench isolation regions are preferably deep enough, i.e. for example about 300 nm.

After providing the STI regions 130 a thin layer (less than 2 nm, preferably less than 1 nm) of chemical oxide (chemox) may be grown optionally on the sidewall surfaces 180 of the pillars 113, 114 (not shown). This chemical oxidation layer may serve as a protection layer of the semiconductor pillars 113, 114 during the following process steps.

A liner 160 is provided along the sidewall surface 180 of the fins 111, 112, 113, 114 (FIG. 19) thereby leaving a cavity 121', 122', 123' in between the fins. The liner 160 may comprise an oxidation resistive material such as for example a layer comprising nitride (for example TiN, SiN) or a layer comprising oxide (for example AlO). The liner 160 has a thickness in the range 5 to 10 nm. The liner 160 may be deposited using a thin film deposition technique such as for example low-pressure chemical vapor deposition. The liner 160 may also be provided on top of the isolation regions 130 at the bottom of the cavities 121', 122', 123'. Other deposition techniques as known for a person skilled in the art may be possible for the formation of the liner 160 such as for example ALD. The liner 160 is preferably a conformal liner along the sidewall surface 180 (with or without the optional chemox layer) of the semiconductor pillar 113, 114.

According to embodiments providing a buried tunnel dielectric layer at the bottom region of the fin comprises transforming the semiconductor material in the bottom region of the fin into a tunnel dielectric material. Transforming the semiconductor material in the bottom region of the fin may be done by oxidizing.

In order to make sure only the bottom region 140 of the fins 111, 112, 113, 114 is transformed into a buried tunnel dielectric layer, the other parts (above the bottom region) should be shielded from being transformed or oxidized. This may be done using the liner 160. The liner 160 comprises a material which can prevent transformation (e.g. oxidation) of the underlying material, i.e. the semiconductor fins 111, 112, 113, 114. The liner 160 may consist of the same material as the hardmask layer 101.

Figure 22:
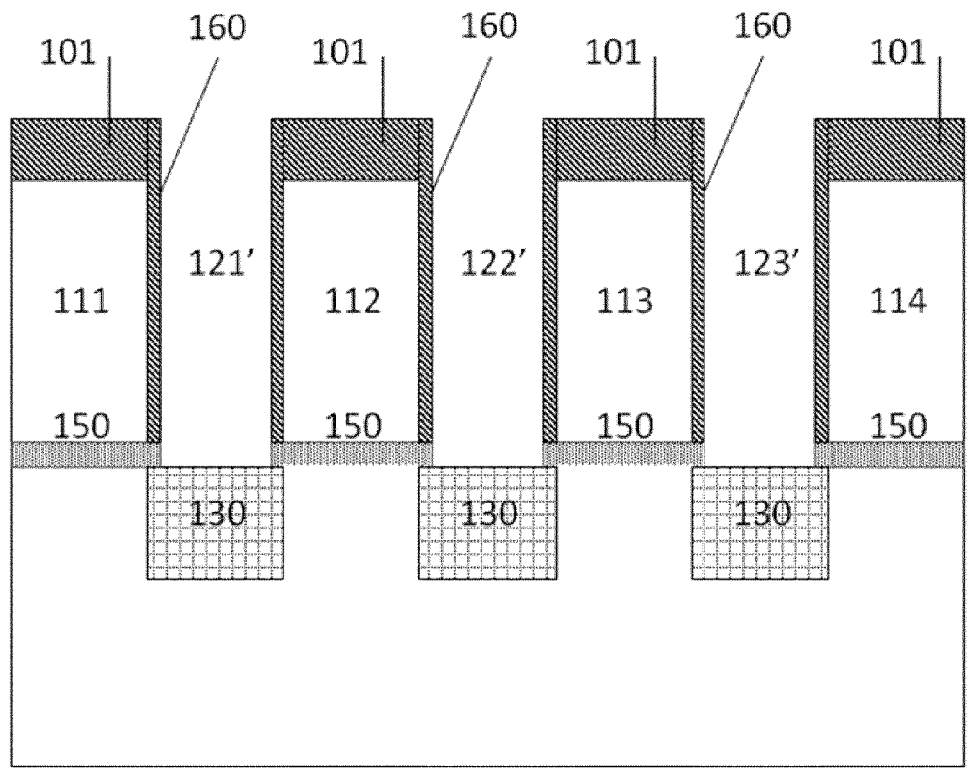

After providing the liner 160, the bottom regions of the fins (dashed regions 140) may be oxidized, as such forming a buried tunnel dielectric layer 150 in the bottom region of the fins (FIG. 22, 150).

Figure 20:
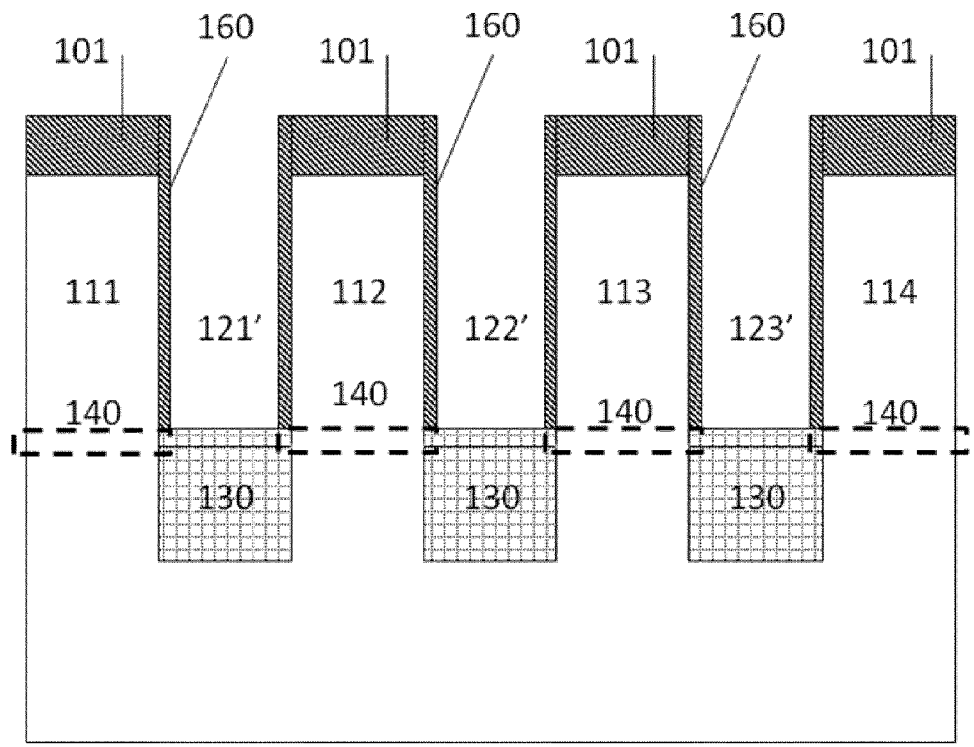

After providing the liner 160, part of the liner 160 which is present (if present at all) on top of the isolation regions 130 at the bottom of the cavities 121', 122', 123' is removed, thereby exposing the shallow trench isolation region 130 (FIG. 20). The liner 160 remains thus present along the sidewall surface of the fins 111, 112, 113, 114. Removing this part of the liner 160 may be done with suitable etching techniques known for a person skilled in the art such as for example with a dry etching step.

Figure 21:
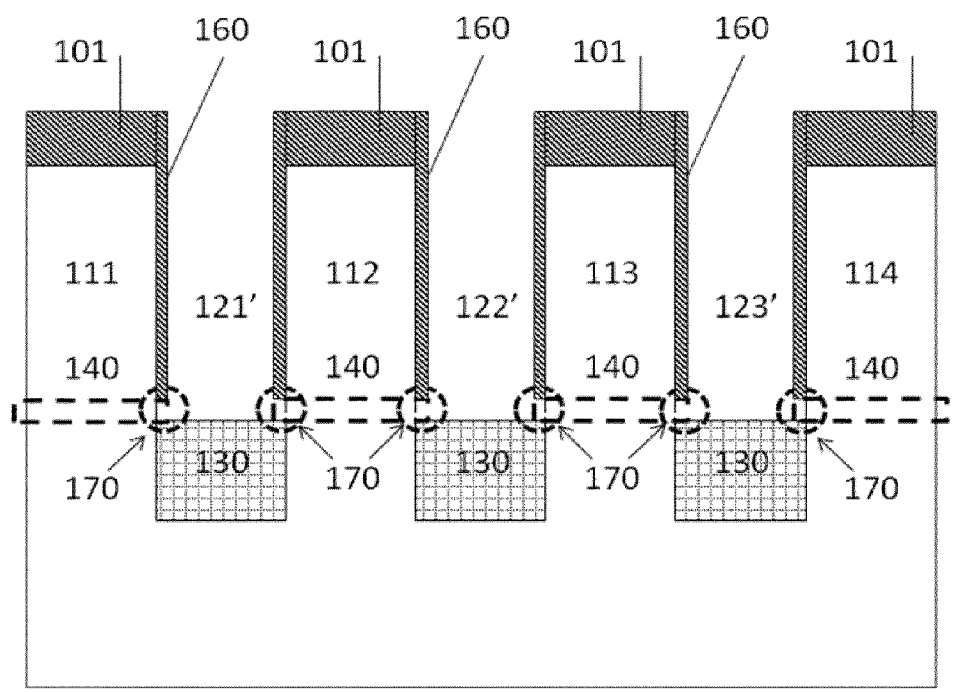

After removing (if necessary) part of the liner (FIG. 20), an isotropic etch step may be used to remove part of the isolation region 130 thereby creating a window opening 170 and as such exposing part of the semiconductor pillar 111, 112, 113, 114 at the bottom region 140 (FIG. 21).

In order to keep the semiconductor material in the bottom region 140 of the semiconductor pillar 111, 112, 113, 114 substantially intact, a selective etching process may be used as known for a person skilled in the art such as for example a dry or a wet etch. During this removal step or etching step damage to the semiconductor material in the bottom region 140 of the fins 111, 112, 113, 114 should be minimized. Underetching of the fins 111, 112, 113, 114 should be minimized.

Removing part of the liner 160 which may be present on top of the isolation regions 130 at the bottom of the cavities 122', 123' and removing part of the isolation region 130 may be done simultaneously or in separate etching process steps.

By etching part of the (shallow trench) isolation region 130 a window opening 170 is created at the bottom region 140 of the semiconductor pillar 111, 112, 113, 114. The width of the window opening 170 at the bottom region 140 of the semiconductor pillar 111, 112, 113, 114 is thus controlled by the etching step of the (shallow trench) isolation region 130 and depends on the etching parameters, such as type of etchant and time of etching. The window opening 170 will further define the thickness of the localized buried tunnel dielectric layer which will be formed at the bottom region 140 of the semiconductor pillar 111, 112, 113, 114.

As the localized buried dielectric layer will serve as the tunnel oxide layer of the semiconductor device, controllability of the thickness and quality of this layer is very important. The thickness of the localized buried dielectric layer may be well controlled by controlling the window opening 170 during the etch step. The quality of the localized buried dielectric layer may be well controlled in the oxidizing step (see further).

After removing part of liner 160, bottom part 170 of the fins 111, 112, 113, 114 is exposed.

The semiconductor material in the bottom region 140 of the fins 111, 112, 113, 114 may be transformed into a dielectric material by oxidizing the semiconductor material via the opening 170 formed at the sidewall surface of the bottom region 140 of the fins 111, 112, 113, 114. A selective oxidation step is preferably used such that only the semiconductor material in the bottom region 140 of the fins 111, 112, 113, 114 is transformed (FIG. 22) as such forming a localized buried tunneling dielectric layer 150.

The selective oxidation step may for example comprise in-situ steam oxidation or wet oxidation or a high temperature decoupled plasma oxidation.

The selective oxidation of the semiconductor material in the bottom region of the fins 111, 112, 113, 114 must be controlled such that substantially the semiconductor material of the other part of the semiconductor pillar remains unchanged i.e. does not oxidize or transform into a dielectric material.

The thickness of the formed buried dielectric layer may be controlled by creating a larger or smaller window opening 170 at the bottom region 140 of the semiconductor pillar 111, 112, 113, 114.

The equivalent oxide thickness (EOT) of the buried dielectric layer is preferably about 10 nm or smaller and serves as a tunnel oxide layer, such as typically used in non-volatile memory devices.

The buried dielectric layer is preferably a high quality tunnel dielectric layer. The quality of the buried tunnel dielectric layer should equal the quality of a thermal oxide layer with a low density of defects and with a high breakdown voltage. With high quality tunnel oxide layer is meant a dielectric layer which has a high breakdown voltage. The breakdown field is preferably larger than 17 mV/cm. The oxide trap density is preferably less than 6e15 cm-3 considering less than 1% failures after 10 years. This means the high quality tunnel oxide traps fewer charges and as a consequence it takes a long time before breakdown of the tunnel oxide layer.

Figure 24:
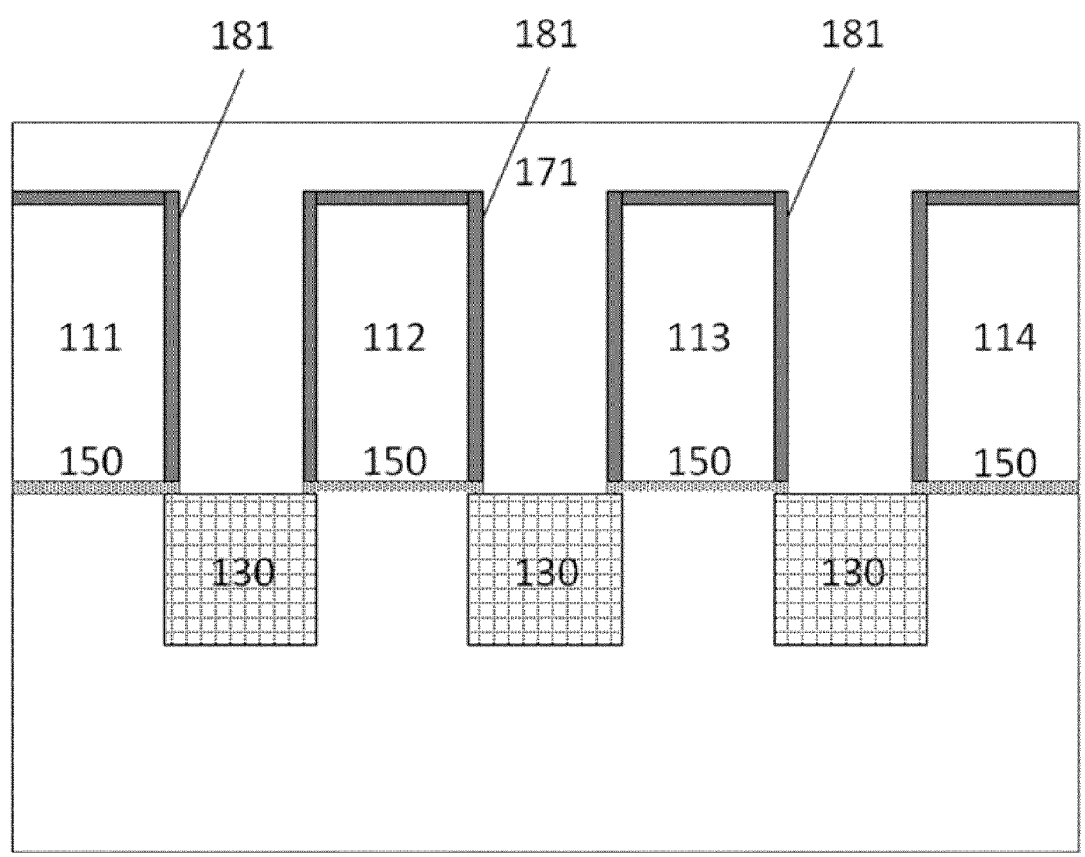

The bottom region 140 of the fins 111, 112, 113, 114 is thus oxidized from two sides of the semiconductor pillar, i.e. via the window opening 170 at both sides of the fin. FIG. 24 gives a schematic representation of a vertical semiconductor memory device according to embodiments of the present invention.

Figure 23:
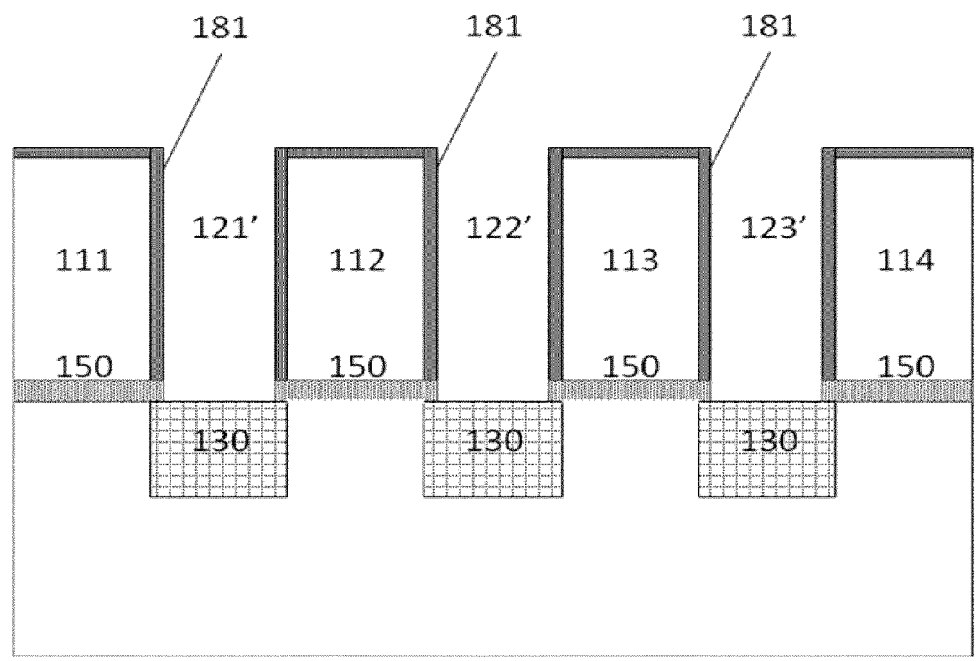

Therefore the hardmask and liner 160 are removed using for example a nitride wet etch and a gate dielectric layer 181 is deposited according techniques known by a person skilled in the art (FIG. 23).

Preferably, the fins are formed of a monocrystalline semiconductor material, preferably monocrystalline Si, and the dielectric on the top and sidewalls of the fins is formed by a thermal oxidation of the fins. Such thermally grown oxide layers are thinner than the traditionally deposited ONO stacks on polycrystalline floating gates. The method of the invention is applicable on a monocrystalline bulk substrate, hence resulting in monocrystalline floating gate structures, hence providing the advantage of being able to produce thin lateral isolation layers. The method of the invention therefore allows scaling down memory devices to the 1X generation node.

Thereafter, a conductive layer 171 is provided on the fins and gate dielectric layer 181. The cavities in between the fins are filled with a conductive material 171. The conductive material 171 is also provided on top of the fins. Further steps may then be done as known for a person skilled in the art such as for example source and drain (s/d) formation and implantation or doping of the fins.

An inventive aspect relates to a multigate semiconductor device, the multigate semiconductor device comprising:
 a semiconductor substrate;
 a fin-based channel region;
 a source region;
 a drain region;
 a localized buried dielectric layer, the localized buried dielectric layer being present over the whole width of the channel region and the localized buried dielectric layer being present only at outer part of the source and drain region.

An inventive aspect relates to a multigate semiconductor device, the multigate semiconductor device comprising:
 a semiconductor substrate;
 a fin-based channel region isolated from the semiconductor substrate by a localized buried dielectric layer;
 a source region only partially isolated from the semiconductor substrate by a localized buried dielectric layer;
 a drain region only partially isolated from the semiconductor substrate by a localized buried dielectric layer.

An inventive aspect relates to a floating gate semiconductor memory device, the floating gate semiconductor memory device comprising:
 a semiconductor substrate
 a floating gate region isolated from the semiconductor substrate by a localized buried tunnel oxide layer;
 an interpoly dielectric layer over the floating gate region
 a control gate region over the interpoly dielectric layer
 a shallow trench isolation region in the semiconductor substrate aside of the floating gate region.

In the methods described above for forming a hybrid bulk/SOI substrate and for forming a floating gate memory device, we have referred to the formation of fins or pillar-like structures. These structures can have different functionalities depending on the type of device that is being produced. In a floating gate device, the fins form the floating gate structures, isolated by the gate dielectric and separated from the underlying substrate by the tunnel oxide. In a multigate device, the fins comprise one or more channel areas. In both cases, a gate structure is arranged above and transverse to the fins. In both cases also, source and drain structures are formed at both longitudinal ends of the fins. According to the invention, the buried dielectric is not only formed in a bottom region 140 of the fins, but also in a bottom region of the source and drain structures. Because the S/D structures are larger (as seen in cross-section parallel to the substrate surface) than the fin structures, the buried dielectric is not formed underneath the totality of the S/D surfaces, but only underneath an outer portion of said S/D surfaces. This is typical therefore of a semiconductor device obtainable by the method of the invention.

FIG. 13b shows a schematic representation of a top view of a multigate semiconductor device fabricated according to embodiments of the present invention. The multigate semiconductor device comprises two fin (channel) regions 600, a source region 601 and a drain region 602 and a gate 604 running over the two fins 600. After the steps for providing a localized buried dielectric layer according to embodiments of the present invention, a localized buried dielectric layer 603 will be present over the whole area of the fin region 600 and over the outer part of the source 601 and drain 602 region. Since the localized buried dielectric layer 603 is the result of a selective oxidation step of the semiconductor material in the bottom region of the fin, source and drain regions 600/601/602 via window openings at the sidewall of the fin/source/drain region, only the outer part of the source 601 and drain 602 region is oxidized, as the dimensions (width) of the source 601 and drain 602 region are typically much larger than the dimension (width) of the fin region. The channel region 600 is thus completely isolated from the underlying semiconductor substrate 605 whereas the source 601 and drain 602 region are only partially isolated from the underlying semiconductor substrate 605.

In case the semiconductor device is a floating gate (FG) memory device, the functionality of the regions is different. The so-called channel region is than the floating gate of the FG device, the so-called gate is the control gate of the FG device. Here also, the S/D regions comprise a buried dielectric in an outer portion of these regions.

In state of the art SOI semiconductor devices (FIG. 13a), the buried oxide layer 503 is present everywhere, i.e. the fins 500, source 501 and drain 502 regions have a buried oxide layer over the whole width/area. In other words, the channel regions 500, the source region 501 and the drain region 502 are thus completely isolated from the underlying semiconductor substrate 505. Also a gate 504 running over the fins is shown.

It is an advantage of a localized buried dielectric layer isolating only part of the source and drain regions of a multigate semiconductor device that fin recovery (typically done with an annealing step) after fin patterning is enhanced. This is due to the fact that the source and drain regions are partially in contact with the underlying semiconductor substrate. In this way, a recovery of the fin, i.e. enhancing fin surface quality and fin mobility using for example a hydrogen annealing step after fin patterning, is possible from the semiconductor substrate towards the semiconductor fin.

The invention claimed is:

1. A method comprising:
 providing a substrate comprising a bulk semiconductor material;
 forming at least two trenches in the substrate, thereby forming at least one fin of the bulk semiconductor material, wherein each of the at least two trenches comprises a trench bottom and trench sidewalls and the fin comprises fin sidewalls having a bottom region;
 filling the at least two trenches with an insulating material;
 partially removing the insulating material from the at least two trenches, wherein partially removing the portion of the insulating material comprises leaving a portion of the insulating material at the bottom of each of the at least two trenches, thereby forming an insulating region at the bottom of each of the at least two trenches;
 depositing a liner at least on the sidewalls of the at least two trenches;
 removing a layer from a top of the insulating region at the bottom of each of the at least two trenches, thereby forming a window opening at the bottom region of the fin sidewalls;
 transforming the bulk semiconductor material of the fin via the window opening, wherein the liner and isolating region at the bottom of each of the at least two trenches substantially limits the transforming to the bottom region of the fin, thereby forming a localized buried dielectric layer in the bottom region of the fin.

2. The method of claim 1, wherein transforming the bulk semiconductor material comprises oxidizing the semiconductor material.

3. The method of claim 1, wherein the bulk semiconductor material comprises a monocrystalline semiconductor material.

4. The method of claim 1, wherein the localized buried dielectric layer has a thickness less than about 10 nm.

5. The method of claim 1, wherein the localized buried dielectric layer has a breakdown field greater than about 17 mV/cm.

6. The method of claim 1, wherein the localized buried dielectric layer has an oxide trap density less than about $6 \times 10^{-15}/cm^3$.

7. The method of claim 1, wherein the substrate comprising the bulk semiconductor material comprises the substrate comprising a bulk region and a silicon-on-insulator (SOI) region.

8. The method of claim 7, wherein forming the at least two trenches in the substrate comprises forming the at least two trenches in the SOI region while the bulk region remains substantially intact.

9. The method of claim 8, wherein one of the at least two trenches electrically isolates the SOI region from the bulk region.

10. The method of claim 7, wherein forming the at least two trenches in the substrate comprises forming the at least two trenches in both the SOI region and the bulk region.

11. The method of claim 1, wherein the at least one fin comprises a first fin and a second fin, wherein the first fin is formed between the at least two trenches and the second fin is formed adjacent to or between the at least two trenches.

12. The method of claim 11, wherein the first fin is electrically isolated from the second fin.

13. The method of claim 1, wherein the liner comprises an oxidation resistive material.

14. The method of claim 13, wherein the liner has a thickness between about 5 nm and about 10 nm.

15. The method of claim 1, wherein removing the layer from the top of the insulating region at the bottom of each of the at least two trenches comprises selectively etching the insulating region at the bottom of each of the at least two trenches.

16. The method of claim 1, further comprising, after partially removing the insulating material from the at least two trenches and before depositing the liner, depositing a protective layer on the trench sidewalls of the at least two trenches.

17. A method comprising:
providing a substrate comprising a bulk semiconductor material;
forming at least two trenches in the substrate, thereby forming at least one fin of the bulk semiconductor material, wherein each of the at least two trenches comprises a trench bottom and trench sidewalls and the at least one fin comprises fin sidewalls having a bottom region;
filling the at least two trenches with an insulating material;
partially removing the insulating material from the at least two trenches, wherein partially removing the portion of the insulating material comprises leaving a portion of the insulating material at the bottom of each of the at least two trenches, thereby forming an insulating region at the bottom of each of the at least two trenches;
depositing a liner at least on the sidewalls of the at least two trenches;
removing a layer from a top of the insulating region at the bottom of each of the at least two trenches, thereby forming a window opening at the bottom region of the fin sidewalls;
transforming the bulk semiconductor material of the at least one fin via the window opening, wherein the liner and isolating region at the bottom of each of the at least two trenches substantially limits the transforming to the bottom region of the at least one fin, thereby forming a localized buried dielectric layer in the bottom region of the at least one fin;
forming a dielectric layer over the at least one fin; and
forming a conductive layer over the dielectric layer, thereby forming a semiconductor device.

18. The method of claim 17, wherein:
the dielectric layer comprises a gate dielectric of the semiconductor device; and
the conductive layer comprises a gate electrode of the semiconductor device.

19. The method of claim 17, wherein:
the semiconductor device comprises a floating gate device; and
the at least one fin comprises at least one floating gate structure.

20. The method of claim 17, wherein:
the semiconductor device comprises a multigate device; and
the at least one fin comprises a channel region.

* * * * *